US011094453B2

(12) United States Patent
Kitatani et al.

(10) Patent No.: US 11,094,453 B2
(45) Date of Patent: Aug. 17, 2021

(54) ELECTRONIC DEVICE AND METHOD FOR MANUFACTURING ELECTRONIC DEVICE

(71) Applicant: TDK Corporation, Tokyo (JP)

(72) Inventors: Kazuharu Kitatani, Tokyo (JP); Kiyomi Yamazaki, Tokyo (JP); Tomokazu Ikarashi, Tokyo (JP)

(73) Assignee: TDK Corporation, Tokyo (JP)

( * ) Notice: Subject to any disclaimer, the term of this patent is extended or adjusted under 35 U.S.C. 154(b) by 206 days.

(21) Appl. No.: 16/133,042

(22) Filed: Sep. 17, 2018

(65) Prior Publication Data

US 2019/0164686 A1    May 30, 2019

(30) Foreign Application Priority Data

Nov. 24, 2017 (JP) .............................. JP2017-225359

(51) Int. Cl.
| | |
|---|---|
| *H01F 27/32* | (2006.01) |
| *H01F 30/04* | (2006.01) |
| *H01F 27/29* | (2006.01) |
| *H01F 27/30* | (2006.01) |
| *H05K 1/02* | (2006.01) |
| *H01F 5/02* | (2006.01) |
| *H01F 5/04* | (2006.01) |

(52) U.S. Cl.
CPC ......... *H01F 27/325* (2013.01); *H01F 27/292* (2013.01); *H01F 27/306* (2013.01); *H01F 30/04* (2013.01); *H05K 1/0227* (2013.01); *H01F 2005/022* (2013.01); *H01F 2005/046* (2013.01)

(58) Field of Classification Search
CPC ...... H01F 27/292; H01F 27/30; H01F 27/306; H01F 27/325; H01F 5/02; H01F 2005/022; H01F 2005/046
USPC ......................................... 336/196, 198, 199
See application file for complete search history.

(56) References Cited

U.S. PATENT DOCUMENTS

2014/0048322 A1* 2/2014 Chen ...................... H05K 3/303
174/260
2019/0150274 A1* 5/2019 Djurdjic ................ H01F 27/324
174/260

FOREIGN PATENT DOCUMENTS

JP             2017-28023 A      2/2017

* cited by examiner

*Primary Examiner* — Tszfung J Chan
(74) *Attorney, Agent, or Firm* — Flynn Thiel, P.C.

(57) ABSTRACT

A substrate includes primary side terminal holes into which the primary side terminals are inserted, secondary side terminal holes into which the secondary side terminals are inserted, and a slit disposed between the primary side terminal holes and the secondary side terminal holes. A transformer is mounted from the side of a mounting surface of the substrate. An insulating member is inserted into the slit from the side of a soldering surface of the substrate. The insulating member includes a protrusion portion that protrudes outside an area defined by virtual lines which are direct extension lines of the width of the slit to the side of the soldering surface. The protrusion portion is formed at a position more distant from the substrate than an end position of the shortest terminal of the primary side terminals and the secondary side terminals from the soldering surface of the substrate.

17 Claims, 5 Drawing Sheets

ELECTRONIC DEVICE AND METHOD FOR MANUFACTURING ELECTRONIC DEVICE

CROSS-REFERENCE TO RELATED APPLICATION

This application claims priority to Japanese Patent Application No. 2017-225359 filed Nov. 24, 2017 which is hereby expressly incorporated by reference herein in its entirety.

BACKGROUND OF THE INVENTION

1. Field of the Invention

The present invention relates to an electronic device that includes a transformer having primary side terminals and secondary side terminals and a substrate on which the transformer is mounted. The present invention more specifically relates to an insulation distance between the primary side terminals and the secondary side terminals of the transformer.

2. Description of the Related Art

Technologies for ensuring an insulation distance between primary side terminals and secondary side terminals, by disposition of an insulating member therebetween, are conventionally known. For example, in Japanese Patent Application Laid-Open No. 2017-28023, a contact portion 34 (reference numerals and symbols used in this paragraph are the same as those of Patent Document 1) and a wall-shaped insulating portion 35 are provided in a bobbin 20 of a transformer 3, between a reference point P1 of protrusion portions protruding from a terminal holder 33b having the shortest separation distance from a magnetic core 23 and a reference point P2 of the magnetic core 23 having the shortest separation distance from the reference point P1, so as to extend a creepage distance between the reference points P1 and P2. Then the transformer 3 is mounted on the substrate 2 such that the wall-shaped insulating portion 35 of the bobbin 20 is inserted into a slit 12 of a substrate 2, and the magnetic core 23 is opposed to a component mounting surface Fa of the substrate 2.

As to mounting of transformers on substrates, there is always a demand for reduction in mounting areas. However, in the transformer described in Japanese Patent Application Laid-Open No. 2017-28023, when its mounting area is further reduced, a terminal distance between primary side terminals and secondary side terminals is necessarily reduced with a reduction in the mounting area. Therefore, the wall-shaped insulating portion inserted into the slit is required to be much longer (further downward relative to ends of the primary side terminals and the secondary side terminals), and thus there has been a problem that large mounting space is required under the substrate (space on the side of a soldering surface of the substrate).

SUMMARY OF THE INVENTION

The present invention has been made to solve the aforementioned problem. It is an object of the invention to provide an electronic device having a transformer and a substrate, in which a sufficient insulation distance is ensured between terminals, i.e., primary side terminals and secondary side terminals, while a mounting area of the transformer is kept small, and that has little effect on space under the substrate and facilitates mounting.

To solve the aforementioned problem, the present invention provides an electronic device that includes a transformer having primary side terminals and secondary side terminals, and a substrate on which the transformer is mounted. In this electronic device, the substrate includes primary side terminal holes into which the primary side terminals are inserted, secondary side terminal holes into which the secondary side terminals are inserted, and a slit disposed between the primary side terminal holes and the secondary side terminal holes. The transformer is mounted from the side of one surface of the substrate. The electronic device further includes an insulating member that is inserted into the slit from the side of the other surface of the substrate. The insulating member has a protrusion portion that protrudes outside an area defined by virtual lines that are direct extension lines of the width of the slit to the side of the other surface, the protrusion portion being formed at a position more distant from the substrate than an end position of the shortest terminal of the primary side terminals and the secondary side terminals from the other surface of the substrate.

According to this structure, even if a mounting area of the transformer is small, an insulation distance (a creepage distance and/or a spatial distance) between the terminals, i.e., the primary side terminals and the secondary side terminals can be sufficiently ensured. Furthermore, since the insulating member extends not only downward but also, for example, in a lateral direction (horizontal direction), relative to the substrate, at the reference position (the position more distant from the substrate than the end position of the shortest terminal of the primary side terminals and the secondary side terminals from the other surface of the substrate), it is possible to provide the electronic device that has little effect on space under the substrate and facilitates mounting.

The protrusion portion that protrudes outside the area defined by the virtual lines preferably further protrudes to a position of an extension of the primary side terminal or the secondary side terminal in an end direction thereof.

According to this structure, it is possible to further ensure the insulation distance between the terminals.

The protrusion portion that protrudes outside the area defined by the virtual lines preferably further protrudes beyond the innermost terminal of the primary side terminals or the secondary side terminals, which is disposed nearest the other side terminals.

According to this structure, it is possible to further ensure the insulation distance between the terminals.

The protrusion portion that protrudes outside the area defined by the virtual lines preferably further protrudes beyond the outermost terminal of the primary side terminals or the secondary side terminals, which is disposed farthest from the other side terminals.

According to this structure, it is possible to further ensure the insulation distance between the terminals.

The protrusion portion that protrudes outside the area defined by the virtual lines preferably further protrudes outside the primary side terminals or the secondary side terminals, and has a folded portion that extends toward the substrate at the outside position, such that, when the insulating member is attached, an end of the folded portion is in contact with the other surface of the substrate.

According to this structure, it is possible to support a load at the end of the folded portion, as well as more reliably ensuring the insulation distance between the terminals, and therefore improves stability in attachment of the insulating member to the substrate.

The present invention can be also regarded as a method for manufacturing an electronic device by mounting a transformer having primary side terminals and secondary side terminals on a substrate. The method includes: forming primary side terminal holes into which the primary side terminals are inserted, secondary side terminal holes into which the secondary side terminals are inserted, and a slit between the primary side terminal holes and the secondary side terminal holes; mounting the transformer from the side of one surface of the substrate and soldering the transformer; and inserting an insulating member into the slit from the side of the other surface of the substrate. At this time, the insulating member includes a protrusion portion that protrudes outside an area defined by virtual lines that are direct extension lines of the width of the slit to the side of the other surface, at a position more distant from the substrate than the protrusion portion being formed at an end position of the shortest terminal of the primary side terminals and the secondary side terminals from the other surface of the substrate.

Application of the present invention allows providing the electronic device having the transformer and the substrate, in which the sufficient insulation distance is ensured between the terminals, i.e., the primary side terminals and the secondary side terminals, while a mounting area of the transformer is kept small, and that has little effect on space under the substrate and facilitates mounting.

DETAILED DESCRIPTION OF THE PREFERRED EMBODIMENTS

Figure 1:
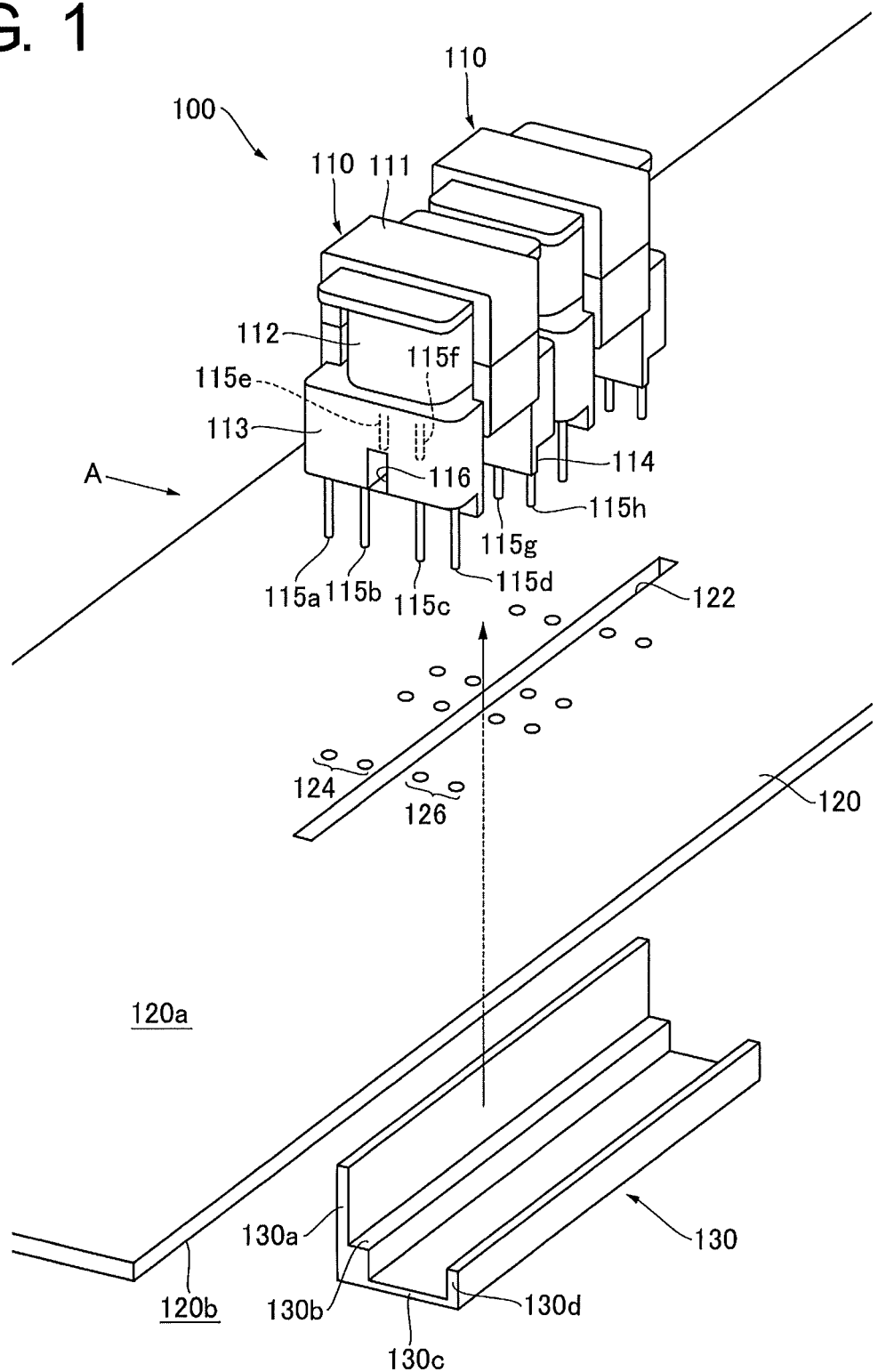
FIG. 1 is an exploded assembly drawing showing the arrangement structure (mounting structure) of an electronic device, which is an example of an embodiment of the present invention, including transformers, a substrate, and an insulating member.

An electronic device 100, i.e., an example of an embodiment of the present invention, will be described below with reference to the attached drawings. For the sake of ease of understanding of the drawings, the size and dimensions of each component are partly emphasized, and hence do not necessarily coincide with those of actual products at some portions. Each drawing is viewed in the orientation of reference numerals, and up and down, left and right, front and back are represented on the basis of the orientation.

<Arrangement Structure (Mounting Structure) of Electronic Device Including Transformers, Substrate, And Insulating Member>

<Operation and Function of the Arrangement Structure (Mounting Structure)>

As shown in FIG. 1, an electronic device 100 includes transformers 110 and a substrate 120 to mount the transformers 110 thereon.

In the transformer 110, a magnetic core 111 is attached to a bobbin 113 on which windings 112 are wound, and eight terminals are erected downward from a bottom surface of the bobbin 113. In this embodiment, the eight terminals are constituted of four primary side terminals 115a, 115b, 115e, and 115f that are electrically connected to primary windings, and four secondary side terminals 115c, 115d, 115g, and 115h that are electrically connected to secondary windings.

In the bottom surface of the bobbin 113, skirt portions 114 are formed to determine a mounting height of the transformer 110 by bringing the portions 114 into contact with a mounting surface 120a of the substrate 120, when the transformer 110 is mounted on the substrate 120. Furthermore, a concave portion 116 is formed in the bobbin 113 between the primary side terminals 115a, 115b, 115e, and 115f and the secondary side terminals 115c, 115d, 115g, and 115h so as to be concave upward from the bottom surface. Into the concave portion 116, an insulating member 130 is partly inserted, as described later, after the completion of mounting on the substrate 120.

In the substrate 120, a slit 122, and a plurality of primary side terminal holes 124 and a plurality of secondary side terminal holes 126, which are disposed across the slit 122, are formed. Note that various components to constitute the electronic device 100 are mounted on the substrate 120, as well as the transformer 110, and a lot of terminal holes are provided in the substrate 120 to attach the components, in actual fact, but these are omitted in the drawings for the sake of ease of understanding, in addition to having no direct relationship with the present invention.

The transformer 110 is mounted on the mounting surface (one surface) 120a of the substrate 120, on which components are to be mounted. At this time, the primary side terminals 115a, 115b, 115e, and 115f are inserted into the primary side terminal holes 124, and the secondary side terminals 115c, 115d, 115g, and 115h are inserted into the secondary side terminal holes 126. After the insertion, these terminals are secured by soldering from the side of a soldering surface (the other surface) 120b of the substrate 120.

The insulating member 130, which is formed approximately in the shape of the letter L when viewed from its side, is inserted into the slit 122 from the side of the soldering surface 120b of the substrate 120. The insulating member 130 is formed of a highly insulative material. The insulating member 130 includes a wall portion 130a to be inserted into the slit 122, a step portion 130b having a thickness so as not to be inserted into the slit 122, a horizontal portion 130c extending in a direction approximately orthogonal to the wall portion 130a, and a folded portion 130d extending upward (approximately in parallel with the wall portion 130a) from an end of the horizontal portion 130c.

Note that, in the above description, the two transformers 110 are arranged side by side over the single slit 122 formed in the substrate 120, but this is just an example, and is not an essential in the present invention. The number of the transformers 110 may be one or three or more.

Figure 2:
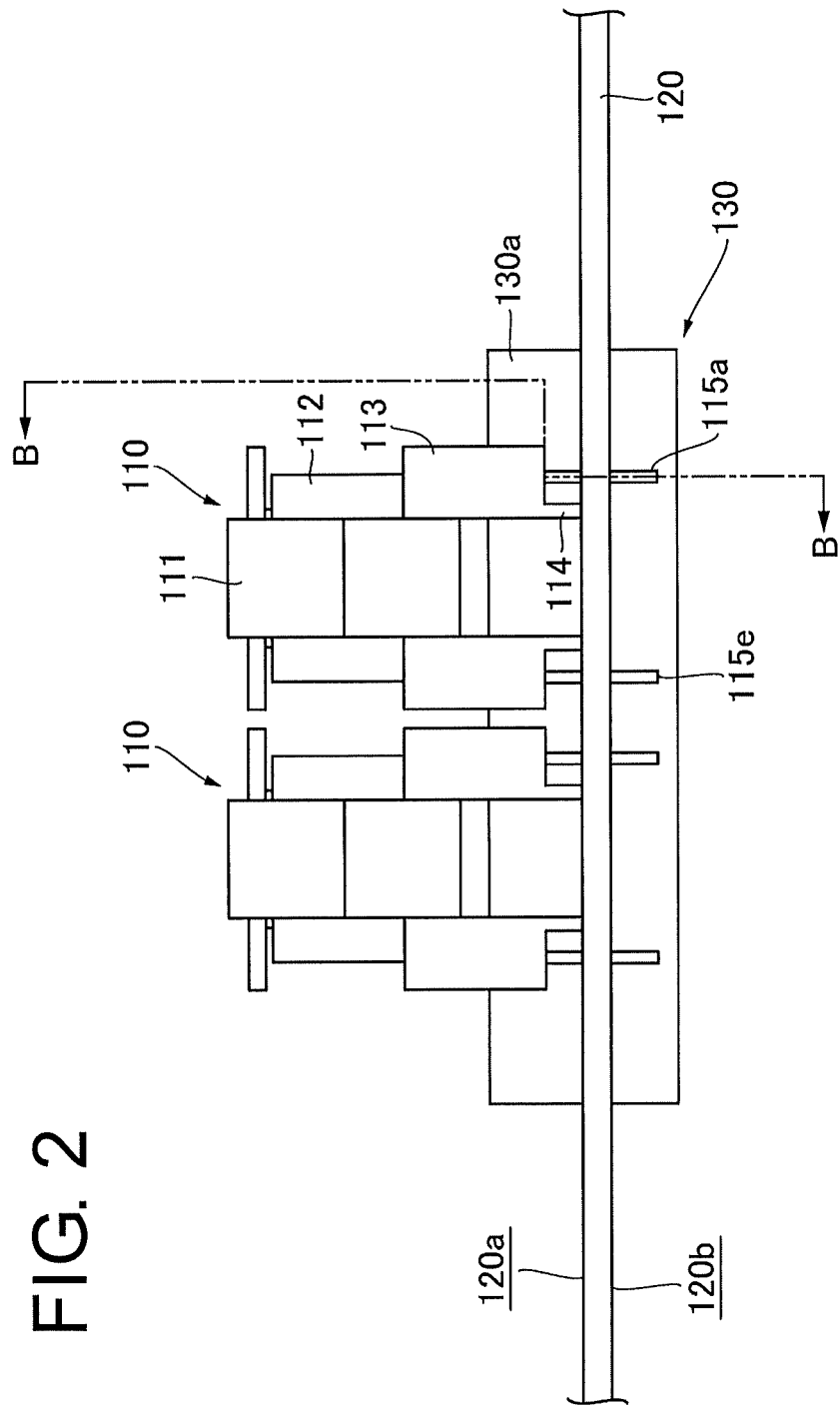
FIG. 2 is a side view showing a state of assembling the transformer, the substrate, and the insulating member viewed from the direction of arrow A (side surface) of FIG. 1.
Figure 3:
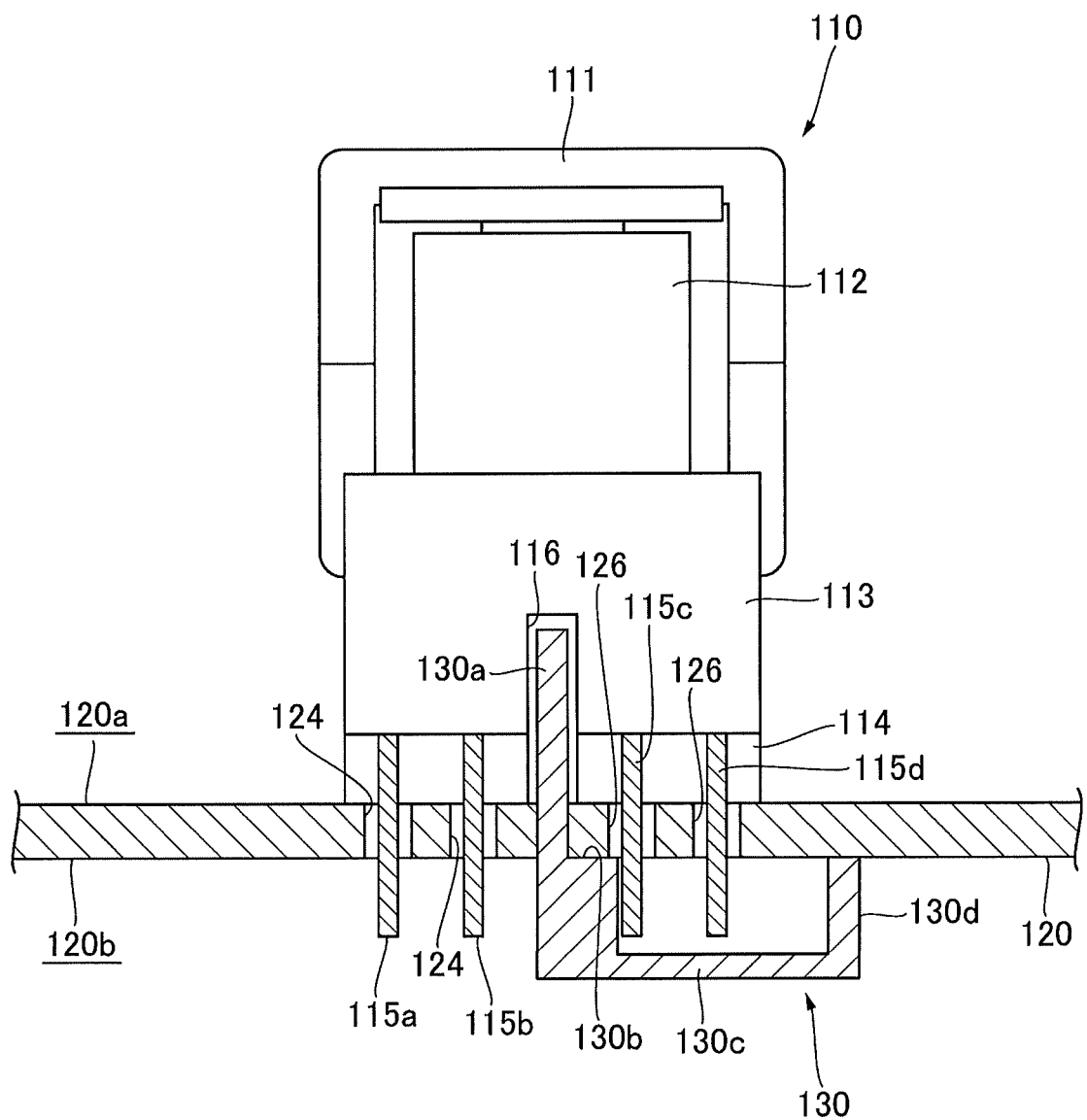
FIG. 3 is a partly sectional view taken along line B-B of FIG. 2.

By attaching (and soldering) the transformers 110 on the substrate 120 and inserting the insulating member 130 into the slit 122, a state shown in FIGS. 2 and 3 is obtained. More specifically, to fix the position of the insulating member 130, the wall portion 130a is inserted into the slit 122, and ends of the step portion 130b and the folded portion 130 are brought into contact with the soldering surface (the other surface) 120b of the substrate 120. The horizontal portion 130c extends not only beyond the secondary side terminal 115c positioned inside (near the slit 122) but also beyond the secondary side terminal 115d positioned outside (far from the slit 122) (the right side in FIG. 3). The folded portion 130d is formed so as to extend from an outer end portion of the horizontal portion 130c toward the substrate 120.

As is apparent from FIG. 3, the primary side terminals 115a and 115b (115e and 115f) and the secondary side terminals 115c and 115d (115g and 115h) are disposed at both sides of the slit 122. Furthermore, the wall portion 130a of the insulating member 130 is being inserted into the concave portion 116.

The above-described positional relationship and structure ensure a large insulation distance (creepage distance and/or spatial distance) between the terminals, i.e., between the primary side terminals 115a, 115b, 115e, and 115f and the secondary side terminals 115c, 115d, 115g, and 115h. Since the wall portion 130a of the insulating member 130 is inserted into the concave portion 116 of the bobbin 113, an insulation distance is ensured on the side of the mounting surface 120a of the substrate 120. At the same time, since the insulating member 130 encloses the secondary side terminals 115c, 115d, 115g, and 115h, a sufficient insulation distance is ensured on the side of the soldering surface 120b of the substrate 120.

Figure 4:
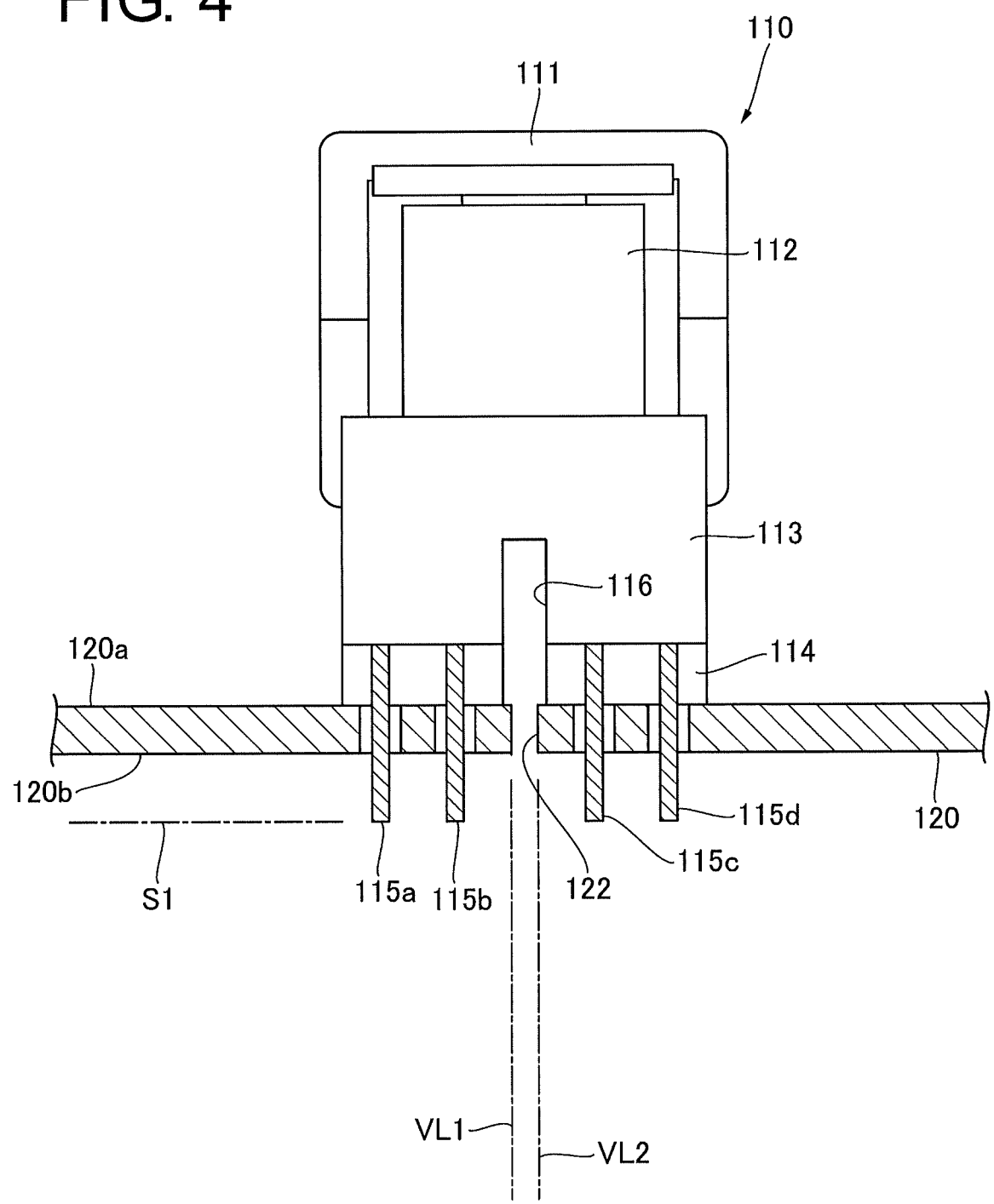
FIG. 4 is a drawing showing a state before attaching the insulating member in FIG. 3.

Note that, the shape of the insulating member 130 is not limited to that described in the above description and illustrated in the drawings. For example, as shown in FIG. 4, an insulation distance is ensured in accordance with a protrusion amount of a protrusion portion, as long as the "protrusion portion" that protrudes below an end position S1 of the shortest terminal (corresponding to all the terminals, because all the terminals have the same length in FIG. 4), when viewed from the soldering surface 120b of the substrate 120, (farther from the soldering surface 120b of the substrate 120), and that protrudes outside an area defined by virtual lines VL1 and VL2 that are downward extension lines of the slit 122 (to the side of the soldering surface 120b) across the substrate 120 is present. After all, "protrusion portion" protrudes outside an area defined by virtual planes that are a pair of downward extension planes of inner peripheral surfaces of the slit 122. In other words, "protrusion portion" protrudes toward the outside in the width direction of the slit 122. In the insulating member 130 described above, the step portion 130b, the horizontal portion 130c, and the folded portion 130d correspond to the "protrusion portion."

Figure 5:
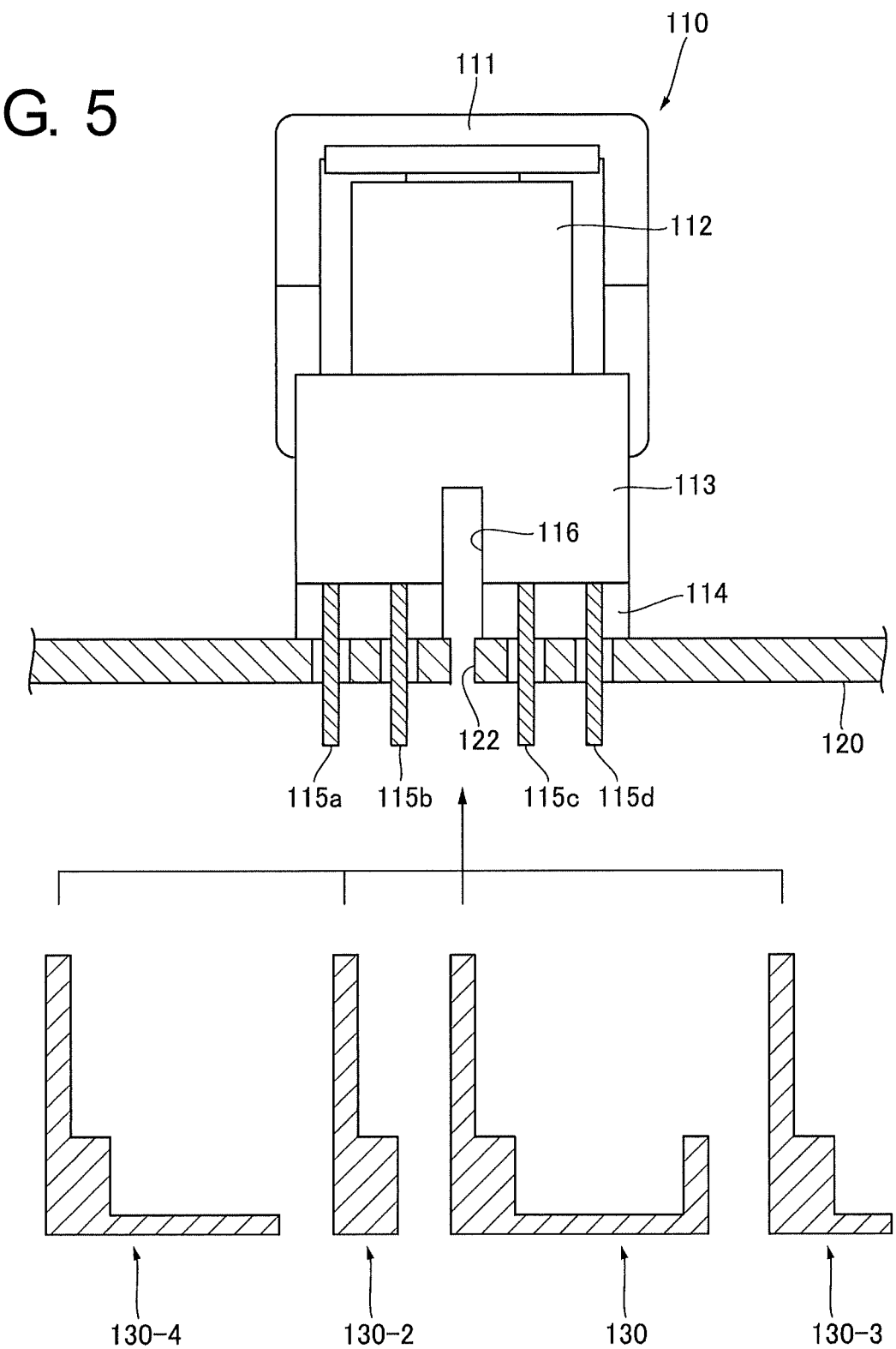
FIG. 5 is a drawing showing examples of variations of the insulating member in FIG. 3.

Accordingly, as shown in FIG. 5, various insulating members can be realized, for example, an insulating member 130-2 constituted of only a wall portion and a step portion, an insulating member 130-3 having a horizontal portion that extends to reach the position under the inside secondary side terminal 115c but does not extend to reach the position under the outside secondary side terminal 115d, and an insulating member 130-4 having a horizontal portion that extends to reach the positions under not only the inside secondary side terminal 115c but also the outside secondary side terminal 115d, as well as the insulating member 130 described above.

As described above, according to the present invention, the electronic device 100 includes the transformer 110 having the primary side terminals 115a, 115b, 115e, and 115f and the secondary side terminals 115c, 115d, 115g, and 115h, and the substrate 120 on which the transformer 110 is mounted. The substrate 120 includes the primary side terminal holes 124 into which the primary side terminals 115a, 115b, 115e, and 115f are inserted, the secondary side terminal holes 126 into which the secondary side terminals 115c, 115d, 115g, and 115h are inserted, and the slit 122 disposed between the primary side terminal holes 124 and the secondary side terminal holes 126. The transformer 110 is mounted from the side of the mounting surface (one surface) 120a of the substrate 120. The insulating member 130 is inserted into the slit 122 from the side of the soldering surface (the other surface) 120b of the substrate 120. The insulating member 130 has the protrusion portion (corresponding to the step portion 130b, the horizontal portion 130c, and the folded portion 130d in the above-described embodiment) that protrudes outside the area defined by the virtual lines VL1 and VL2, which are direct extension lines of the width of the slit 122 to the side of the soldering surface (the other surface) 120b, at a position more distant from the substrate 120 than the end position S1 of the shortest terminal of the primary side terminals 115a, 115b, 115e, and 115f and the secondary side terminals 115c, 115d, 115g, and 115h from the soldering surface (the other surface) 120b of the substrate 120.

According to this structure, even if the mounting area of the transformer 110 is small, a creepage distance and/or a spatial distance between the primary side terminals 115a, 115b, 115e, and 115f and the secondary side terminals 115c, 115d, 115g, and 115h can be ensured, thus ensuring a sufficient insulation distance between the terminals. Furthermore, since the insulating member extends not only downward but also in a lateral direction (horizontal direction), relative to the substrate 120, at the reference position (the position more distant from the substrate 120 than the end position S1 of the shortest terminal of the primary side terminals 115a, 115b, 115e, and 115f and the secondary side terminals 115c, 115d, 115g, and 115h from the soldering surface (the other surface) 120b of the substrate 120), the transformer 110 can be easily mounted without having little effect on space under the substrate 120.

The protrusion portion that protrudes outside the area defined by the virtual lines VL1 and VL2 preferably further protrudes to a position of an extension of the primary side terminal 115a, 115b, 115e, or 115f or the secondary side terminal 115c, 115d, 115g, or 115h in an end direction thereof. This allows ensuring the insulation distance between the primary side terminals and the secondary side terminals.

The protrusion portion that protrudes outside the area defined by the virtual lines VL1 and VL2 preferably further protrudes beyond the innermost terminal (corresponding to the secondary side terminal 115c in the above-described embodiment) of the primary side terminals 115a, 115b, 115e, and 115f or the secondary side terminals 115c, 115d, 115g, and 115h, which is disposed nearest the other side terminals. This allows reliably ensuring the insulation distance between the primary side terminals and the secondary side terminals.

The protrusion portion that protrudes outside the area defined by the virtual lines VL1 and VL2 preferably further protrudes beyond the outermost terminal (corresponding to the secondary side terminal 115d in the above-described embodiment) of the primary side terminals 115a, 115b, 115e, and 115f or the secondary side terminals 115c, 115d, 115g, and 115h, which is disposed farthest from the other side terminals. This allows more reliably ensuring the insulation distance between the primary side terminals and the secondary side terminals.

The protrusion portion that protrudes outside the area defined by the virtual lines VL1 and VL2 may further protrude outside the primary side terminals 115a, 115b, 115e, and 115f or the secondary side terminals 115c, 115d, 115g, and 115h, and may have the folded portion 130d that extends toward the substrate 120 at the outside position, such that, when the insulating member 130 is attached, an end of the folded portion 130d contacts the other surface 120b of the substrate 120. This allows supporting a load at the end of the folded portion 130d, as well as more reliably ensuring the insulation distance between the terminals, and therefore contributes to giving stability in attachment of the insulating member 130 to the substrate 120.

The present invention can be also regarded as a method for manufacturing the electronic device 100 by mounting the transformer 110 having the primary side terminals 115a, 115b, 115e, and 115f and the secondary side terminals 115c, 115d, 115g, and 115h on the substrate 120. The method includes: forming the primary side terminal holes 124 into which the primary side terminals 115a, 115b, 115e, and 115f are inserted, the secondary side terminal holes 126 into which the secondary side terminals 115c, 115d, 115g, and 115h are inserted, and the slit 122 between the primary side terminal holes 124 and the secondary side terminal holes 126; mounting the transformer 110 from the side of the mounting surface (one surface) 120a of the substrate 120 and soldering the transformer 110; and inserting the insulating member 130 into the slit 122 from the side of the soldering surface (the other surface) 120b of the substrate 120. At this time, the insulating member 130 includes the protrusion portion that protrudes outside the area defined by the virtual lines VL1 and VL2, which are direct extension lines of the width of the slit 122 to the side of the soldering surface (the other surface) 120b, the protrusion portion being formed at a position more distant from the substrate 120 than the end position S1 of the shortest terminal of the primary side terminals 115a, 115b, 115e, and 115f and the secondary side terminals 115c, 115d, 115g, and 115h from the soldering surface (the other surface) of the substrate 120.

The electronic device according to the embodiment of the present invention and the method for manufacturing the electronic device are described above, but the present invention can be variously modified and implemented without being limited to the above description of the embodiment. For example, the horizontal portion 130c of the insulating member 130 is attached so as to enclose the secondary side terminals 115c, 115d, 115g, and 115h in the above description, but may be attached so as to enclose the primary side terminals 115a, 115b, 115e, and 115f instead. The insulating member itself may be formed into a different shape (not approximately in the shape of the letter L but approximately in the shape of the inverted letter T in cross section) so as to enclose both of the terminals.

What is claimed is:

1. An electronic device comprising:
a transformer having primary side terminals and secondary side terminals; and
a substrate on which the transformer is mounted;
wherein the substrate includes:
primary side terminal holes into which the primary side terminals are inserted,
secondary side terminal holes into which the secondary side terminals are inserted, and
a slit disposed between the primary side terminal holes and the secondary side terminal holes;
the transformer being mounted from a side of one surface of the substrate;
the electronic device further comprising an insulating member that is inserted into the slit from a side of the other surface of the substrate;
the insulating member having a protrusion portion that protrudes outside an area defined by virtual lines that are direct extension lines of a width of the slit to the side of the other surface, the protrusion portion being formed at a position more distant from the substrate than an end position of a shortest terminal of the primary side terminals and the secondary side terminals from the other surface of the substrate;
the transformer having a concave portion into which the insulating member is partly inserted between the primary side terminals and the secondary side terminals; and
the insulating member being inserted into the slit and the concave portion from the side of the other surface of the substrate.

2. The electronic device according to claim 1, wherein the protrusion portion that protrudes outside the area defined by the virtual lines further protrudes to a position of a virtual an extension of the primary side terminal or the secondary side terminal away from the substrate.

3. The electronic device according to claim 1, wherein the protrusion portion that protrudes outside the area defined by the virtual lines further protrudes beyond an innermost terminal of the primary side terminals disposed nearest the secondary side terminals or the secondary side terminals disposed nearest the primary side terminals.

4. The electronic device according to claim 2, wherein the protrusion portion that protrudes outside the area defined by the virtual lines further protrudes beyond an innermost terminal of the primary side terminals disposed nearest the secondary side terminals or the secondary side terminals disposed nearest the primary side terminals.

5. The electronic device according to claim 1, wherein the protrusion portion that protrudes outside the area defined by the virtual lines further protrudes beyond an outermost terminal of the primary side terminals disposed farthest from the secondary side terminals or the secondary side terminals disposed farthest from the primary side terminals.

6. The electronic device according to claim 2, wherein the protrusion portion that protrudes outside the area defined by the virtual lines further protrudes beyond an outermost terminal of the primary side terminals disposed farthest from the secondary side terminals or the secondary side terminals disposed farthest from the primary side terminals.

7. The electronic device according to claim 3, wherein the protrusion portion that protrudes outside the area defined by the virtual lines further protrudes beyond an outermost terminal of the primary side terminals disposed farthest from the secondary side terminals or the secondary side terminals disposed farthest from the primary side terminals.

8. The electronic device according to claim 4, wherein the protrusion portion that protrudes outside the area defined by the virtual lines further protrudes beyond an outermost terminal of the primary side terminals disposed farthest from the secondary side terminals or the secondary side terminals disposed farthest from the primary side terminals.

9. The electronic device according to claim 1, wherein:
the protrusion portion that protrudes outside the area defined by the virtual lines further protrudes outside the primary side terminals or the secondary side terminals, and has a folded portion that extends toward the substrate at an outside position, such that, when the insulating member is attached, an end of the folded portion is in contact with the other surface of the substrate.

10. The electronic device according to claim 2, wherein:
the protrusion portion that protrudes outside the area defined by the virtual lines further protrudes outside the primary side terminals or the secondary side terminals, and has a folded portion that extends toward the substrate at an outside position, such that, when the insulating member is attached, an end of the folded portion is in contact with the other surface of the substrate.

11. The electronic device according to claim 3, wherein: the protrusion portion that protrudes outside the area defined by the virtual lines further protrudes outside the primary side terminals or the secondary side terminals, and has a folded portion that extends toward the substrate at an outside position, such that, when the insulating member is attached, an end of the folded portion is in contact with the other surface of the substrate.

12. The electronic device according to claim 4, wherein: the protrusion portion that protrudes outside the area defined by the virtual lines further protrudes outside the primary side terminals or the secondary side terminals, and has a folded portion that extends toward the substrate at an outside position, such that, when the insulating member is attached, an end of the folded portion is in contact with the other surface of the substrate.

13. The electronic device according to claim 5, wherein: the protrusion portion that protrudes outside the area defined by the virtual lines further protrudes outside the primary side terminals or the secondary side terminals, and has a folded portion that extends toward the substrate at an outside position, such that, when the insulating member is attached, an end of the folded portion is in contact with the other surface of the substrate.

14. The electronic device according to claim 6, wherein: the protrusion portion that protrudes outside the area defined by the virtual lines further protrudes outside the primary side terminals or the secondary side terminals, and has a folded portion that extends toward the substrate at an outside position, such that, when the insulating member is attached, an end of the folded portion is in contact with the other surface of the substrate.

15. The electronic device according to claim 7, wherein: the protrusion portion that protrudes outside the area defined by the virtual lines further protrudes outside the primary side terminals or the secondary side terminals, and has a folded portion that extends toward the substrate at an outside position, such that, when the insulating member is attached, an end of the folded portion is in contact with the other surface of the substrate.

16. The electronic device according to claim 8, wherein: the protrusion portion that protrudes outside the area defined by the virtual lines further protrudes outside the primary side terminals or the secondary side terminals, and has a folded portion that extends toward the substrate at an outside position, such that, when the insulating member is attached, an end of the folded portion is in contact with the other surface of the substrate.

17. A method for manufacturing an electronic device by mounting a transformer having primary side terminals and secondary side terminals on a substrate, the method comprising:
  forming primary side terminal holes into which the primary side terminals are inserted, secondary side terminal holes into which the secondary side terminals are inserted, and a slit between the primary side terminal holes and the secondary side terminal holes in the substrate;
  forming a concave portion into which an insulating member is partly inserted between the primary side terminals and the secondary side terminals in the transformer;
  mounting the transformer from a side of one surface of the substrate and soldering the transformer; and
  inserting the insulating member into the slit and the concave portion from a side of the other surface of the substrate after the completion of mounting the transformer on the substrate;
  wherein at this time, the insulating member has a protrusion portion that protrudes outside an area defined by virtual lines that are direct extension lines of a width of the slit to the side of the other surface, the protrusion portion being formed at a position more distant from the substrate than an end position of a shortest terminal of the primary side terminals and the secondary side terminals from the other surface of the substrate.

* * * * *